United States Patent
Kawakami (10) Patent No.: US 12,217,941 B2
(45) Date of Patent: Feb. 4, 2025

(54) PLASMA PROCESSING APPARATUS, AND PLASMA PROCESSING METHOD

(71) Applicant: TOKYO ELECTRON LIMITED, Tokyo (JP)

(72) Inventor: Satoru Kawakami, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/008,642

(22) PCT Filed: Jun. 4, 2021

(86) PCT No.: PCT/JP2021/021369
§ 371 (c)(1),
(2) Date: Dec. 6, 2022

(87) PCT Pub. No.: WO2021/256302
PCT Pub. Date: Dec. 23, 2021

(65) Prior Publication Data
US 2023/0223239 A1  Jul. 13, 2023

(30) Foreign Application Priority Data
Jun. 18, 2020  (JP) ................ 2020-105107

(51) Int. Cl.
*H01J 37/32* (2006.01)
*B08B 7/00* (2006.01)
(Continued)

(52) U.S. Cl.
CPC ...... *H01J 37/32495* (2013.01); *B08B 7/0035* (2013.01); *H01J 37/32183* (2013.01);
(Continued)

(58) Field of Classification Search
None
See application file for complete search history.

(56) References Cited

U.S. PATENT DOCUMENTS

| 7,956,638 B2* | 6/2011 | Iizuka | H03K 19/017581 327/108 |
| 2016/0013029 A1* | 1/2016 | Chae | H01J 37/32669 156/345.49 |
| 2018/0025930 A1* | 1/2018 | Augustyniak | H01L 21/68771 438/798 |

FOREIGN PATENT DOCUMENTS

JP     2010-520646 A     6/2010
JP     2010531538 A  *  9/2010

OTHER PUBLICATIONS

Google Patents translation of JP2010531538A (Year: 2024).*
(Continued)

*Primary Examiner* — Eric W Golightly
(74) *Attorney, Agent, or Firm* — Fenwick & West LLP (57) ABSTRACT

A plasma processing apparatus for cleaning a peripheral portion of a substrate by plasma and comprising a depressurizable processing container accommodating a substrate is disclosed. The processing container includes a substrate support for supporting a substrate and including a central electrode facing a central portion of the supported substrate supported by the substrate support; a lower ring electrode formed in a ring shape to face a lower surface of a peripheral portion of the substrate supported by the substrate support; and an upper ring electrode disposed to face an upper surface of the peripheral portion of the substrate supported by the substrate support. The central electrode is grounded, a radio frequency (RF) power is supplied to each of the upper and lower ring electrodes, and the RF power is supplied to at least one of the upper and lower ring electrodes via a phase adjuster configured to adjust the phase of the RF power.

8 Claims, 3 Drawing Sheets

(51) Int. Cl.
 *H01L 21/02* (2006.01)
 *H01L 21/683* (2006.01)
(52) U.S. Cl.
 CPC .. *H01J 37/32568* (2013.01); *H01J 37/32834* (2013.01); *H01L 21/02087* (2013.01); *H01L 21/6833* (2013.01); *H01J 2237/038* (2013.01); *H01J 2237/335* (2013.01)

(56) References Cited

OTHER PUBLICATIONS

PCT International Search Report, PCT Application No. PCT/JP2021/021369, Aug. 10, 2021, 9 pages (with English translation of PCT International Search Report).

* cited by examiner

PLASMA PROCESSING APPARATUS, AND PLASMA PROCESSING METHOD

TECHNICAL FIELD

The present disclosure relates to a plasma processing apparatus and a plasma processing method.

BACKGROUND

Patent Document 1 discloses a plasma processing chamber configured to clean a beveled edge of a substrate. The plasma processing chamber includes a substrate support configured to receive a substrate and a bottom edge electrode surrounding the substrate support. The bottom edge electrode and the substrate support are electrically connected by a bottom dielectric ring. Further, the surface of the bottom edge electrode facing the substrate is covered with a bottom dielectric film. The plasma processing chamber further includes a top edge electrode surrounding a top insulator facing the substrate support. The top edge electrode is electrically grounded. The top edge electrode and the bottom edge electrode face each other and are configured to generate cleaning plasma to clean the beveled edge of the substrate.

PRIOR ART DOCUMENTS

Patent Documents

Patent Document 1: Japanese Laid-open Patent Publication No. 2010-520646

SUMMARY

Problems to be Resolved by the Invention

The technique of the present disclosure appropriately removes an unnecessary film formed at a peripheral portion of a substrate without damaging the substrate even if the film formation state on the upper surface of the peripheral portion of the substrate is different from the film formation state on the lower surface of the peripheral portion of the substrate, in the case of cleaning the peripheral portion of the substrate using plasma.

Means of Solving the Problems

One aspect of the subject disclosure provides a plasma processing apparatus for cleaning a peripheral portion of a substrate by plasma. The plasma processing apparatus comprises a depressurizable processing container accommodating a substrate, and the processing container includes therein: a substrate support configured to support a substrate and including a central electrode facing a central portion of the substrate supported by the substrate support; a lower ring electrode formed in a ring shape to face a lower surface of a peripheral portion of the substrate supported by the substrate support; and an upper ring electrode disposed to face an upper surface of the peripheral portion of the substrate supported by the substrate support. The central electrode is grounded and a radio frequency (RF) power is supplied to each of the upper ring electrode and the lower ring electrode, such that the RF power is supplied to at least one of the upper ring electrode and the lower ring electrode via a phase adjuster configured to adjust the phase of the RF power.

Effect of the Invention

In accordance with the present disclosure, it is possible to appropriately remove an unnecessary film formed at a peripheral portion of a substrate without damaging the substrate even if the film formation state is different between the upper surface and the lower surface of the peripheral portion of the substrate, in the case of cleaning the peripheral portion of the substrate using plasma.

DETAILED DESCRIPTION

In a manufacturing process of semiconductor devices and the like, various processing, such as film formation and the like, are performed on a substrate such as a semiconductor wafer (hereinafter referred to as "wafer").

After film formation, an unnecessary film may be formed at the beveled portion of the substrate. The unnecessary film formed at the beveled portion has low adhesiveness to the substrate, and, thus, may be peeled off during transfer of the substrate or the like and contaminate other substrates or the inside of the apparatus.

In order to prevent such contamination, bevel cleaning may be performed to remove an unnecessary film formed at the beveled portion of the substrate.

As a technique related to bevel cleaning, there is suggested a technique using plasma disclosed in Patent Document 1.

In Patent Document 1, a substrate support on which a substrate is placed, a bottom edge electrode surrounding the substrate support, and a top edge electrode surrounding an insulator plate facing the substrate support are provided. Plasma for use in bevel cleaning is generated between the top edge electrode and the bottom edge electrode by grounding the top edge electrode and supplying an RF power to the bottom edge electrode. In Patent Document 1, the substrate support is configured to have a high resistivity so as not to attract an RF power.

Depending on the structure of the stage supporting the substrate during film formation and its neighboring structures, the film formation state may be different between the upper surface and the lower surface of the beveled portion of the substrate.

For example, in the case of forming a film using plasma, the quality or thickness of a film formed on the upper surface of the beveled portion, where the amount of ions is large, may be different from that of a film formed on the lower surface of the beveled portion, where the amount of ions is small. Even when plasma is not used, the quality or film thickness may be different between the upper surface of the substrate and the backside of the substrate, due to the influence of a processing temperature or the like.

When the film formation state is different between the upper surface and the lower surface of the beveled portion of the substrate, the technique disclosed in Patent Document 1 may not perform appropriate bevel cleaning on both the upper surface and the lower surface of the beveled portion without damaging the substrate. This will be described in detail below. In other words, in the technique disclosed in Patent Document 1, plasma for use in bevel cleaning is generated by grounding the top edge electrode and supplying an RF power to the bottom edge electrode, and the plasma state at the upper portion of the beveled portion is associated with the plasma state at the lower portion of the beveled portion. Therefore, when the film formation state is different between the upper surface and the lower surface of the beveled portion of the substrate, if the bevel cleaning is performed in a way appropriate for one of the upper surface and the lower surface where an unnecessary film is thick, for example, the other surface where the unnecessary film is thin is exposed to plasma even after the removal of the unnecessary film and, thus, damaged. On the other hand, if the bevel cleaning is performed in a way appropriate for one of the upper surface and the low surface where the unnecessary film is thin, the bevel cleaning performed on the other surface where the unnecessary film is thick becomes insufficient.

Therefore, the technique of the present disclosure can appropriately clean the peripheral portion of the substrate using plasma without damaging the substrate even when the film formation state is different between the upper surface and the lower surface of the peripheral portion of the substrate.

Hereinafter, a plasma processing apparatus and a plasma processing method of the present embodiment will be described with reference to the accompanying drawings. Like reference numerals will be given to like parts having substantially the same functions and configurations throughout this specification, and redundant description thereof will be omitted.

Figure 1:
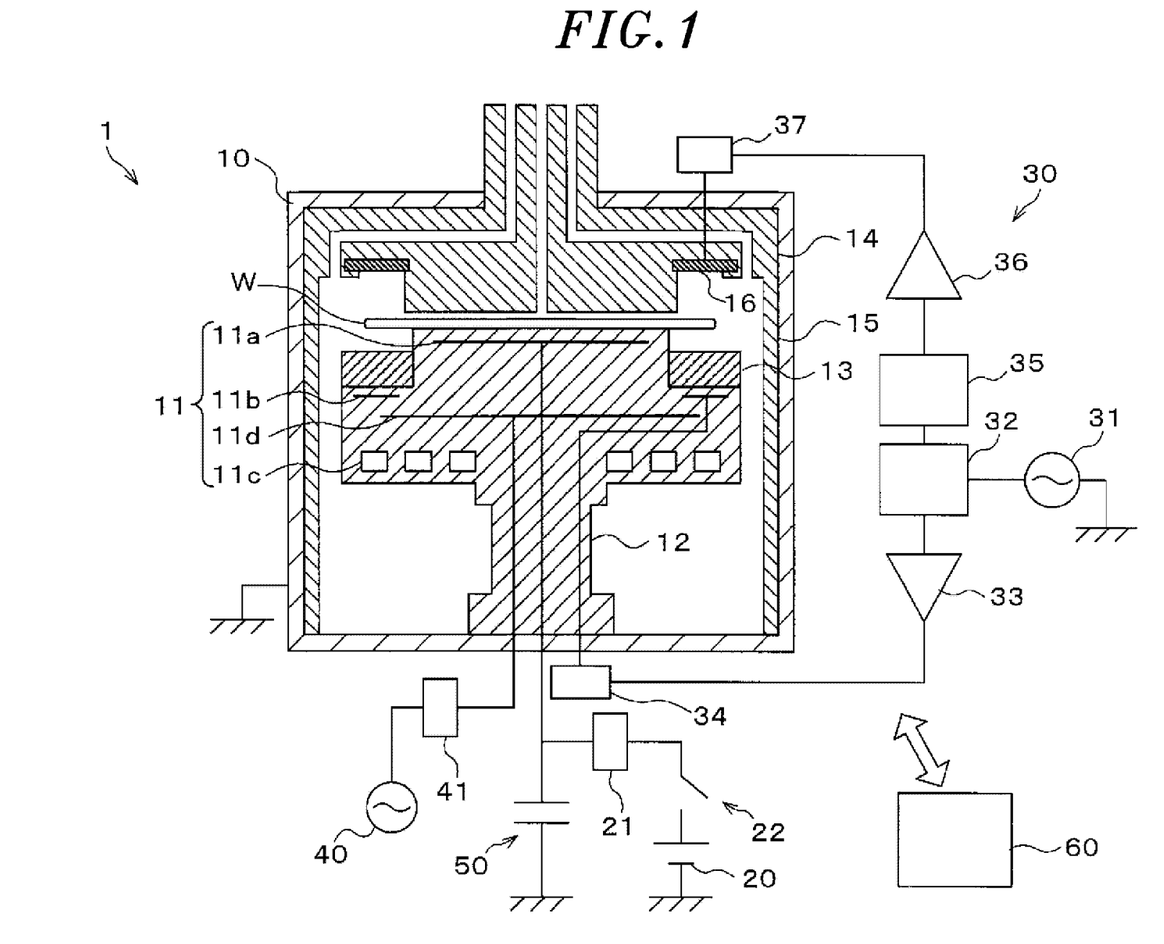
FIG. 1 is a vertical cross-sectional view showing a schematic configuration of a wafer processing apparatus as a plasma processing apparatus according to an embodiment.
Figure 2:
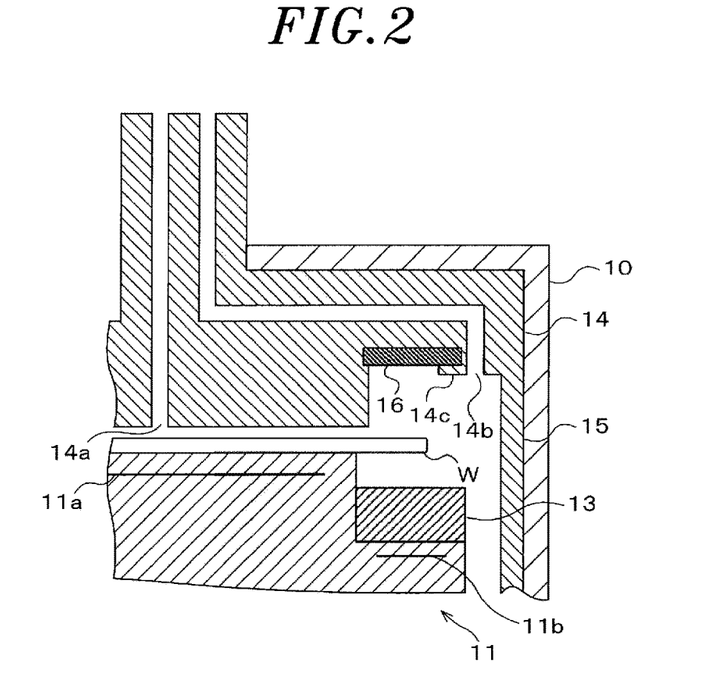
FIG. 2 provides a partially enlarged view of FIG. 1.
Figure 3:
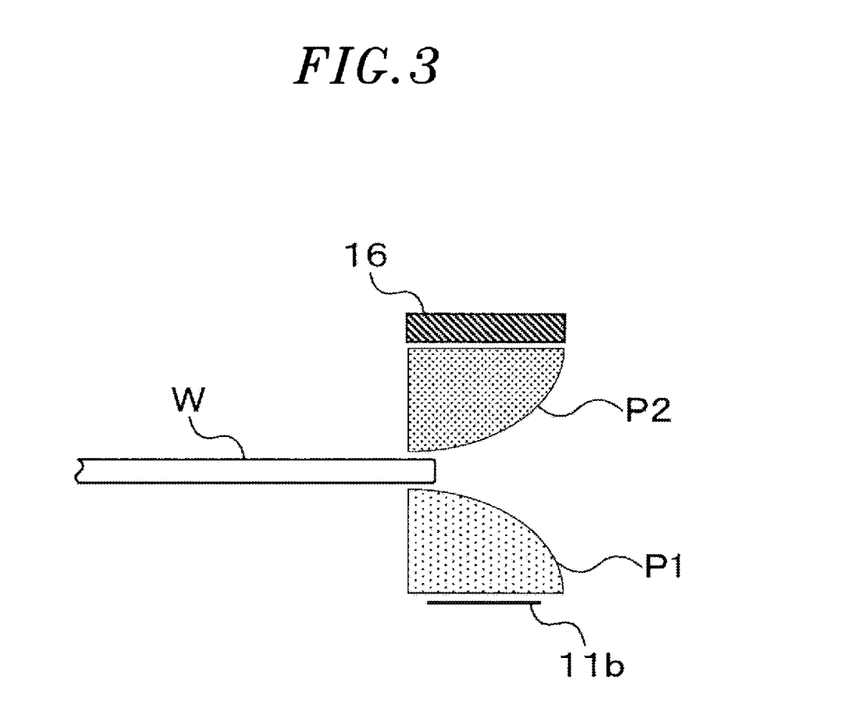
FIG. 3 schematically shows a state of plasma generated in a processing container, representing a state in which a radio frequency power supplied to a lower ring electrode and a radio frequency power supplied to an upper ring electrode are in phase.
Figure 4:
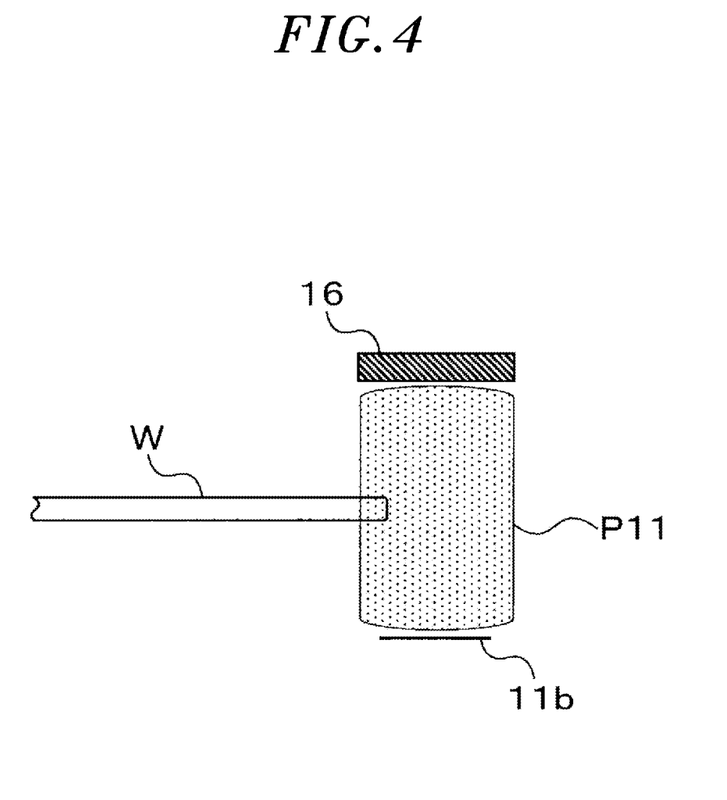
FIG. 4 schematically describes a state of plasma generated in the processing container, indicating a state in which the radio frequency power supplied to the lower ring electrode and the radio frequency power supplied to the upper ring electrode are anti-phase.

FIG. 1 is a vertical cross-sectional view showing a schematic configuration of a wafer processing apparatus as a plasma processing apparatus according to an embodiment. FIG. 2 is a partially enlarged view of FIG. 1. FIGS. 3 and 4 schematically show states of plasma generated in a processing container to be described later. FIG. 3 shows the state in which an RF power supplied to a lower ring electrode to be described later and an RF power supplied to an upper ring electrode to be described later are in phase, and FIG. 4 shows the state in which they are anti-phase.

The wafer processing apparatus 1 cleans a peripheral portion of a wafer W, which is a substrate, using plasma, and includes a substantially cylindrical processing container 10, for example. The processing container 10, which accommodates the wafer W, is made of aluminum, for example, and is grounded. Further, the processing container 10 is connected to an exhaust device (not shown) for exhausting the processing container 10. The exhaust device is connected to a bottom wall of the processing container 10, for example.

A stage 11 as a substrate support is disposed in the processing container 10. The stage 11 supports the wafer W, and is fixed to the bottom wall of the processing chamber 10 via a leg member 12.

The stage 11 is formed in a substantially columnar shape having a central portion protruding upward. A central electrode 11a is disposed in the protruding upper central portion of the stage 11. A lower ring electrode 11b is disposed in the upper peripheral portion of the stage 11.

The central electrode 11a is formed to face the central portion of the wafer W supported by the stage 11. A DC power supply 20 is electrically connected to the central electrode 11a through a filter 21 and a switch 22. The wafer W can be attracted and held on the stage 11 by a Coulomb force generated by applying a DC voltage from the DC power supply 20 to the central electrode 11a. The filter 21 blocks an RF power for plasma generation to protect the DC power supply 20 from the RF power. The switch 22 switches between application and non-application of a DC voltage from the DC power supply 20 to the central electrode 11a.

Further, the central electrode 11a is grounded via an impedance adjustment circuit 50 to be described later. A DC power supply line including the filter 21, the switch 22, and the DC power supply 20 is connected between the central electrode 11a and the impedance adjustment circuit 50 in the line (i.e., the ground line) that grounds the central electrode 11a.

The lower ring electrode 11b is formed in an annular ring shape that is concentric with the stage 11 to face the lower surface of the peripheral portion of the wafer W supported by the stage 11. In this specification, "peripheral portion of the wafer W" indicates a peripheral portion of the wafer W that includes at least a beveled portion. The RF power is supplied from an RF power supply mechanism 30 to the lower ring electrode lib to generate plasma in the processing container 10. The RF power supply mechanism 30 will be described in detail later.

A coolant channel 11c as a cooling mechanism is formed in the lower part of the stage 11. The coolant channel 11c is used to cool a lower insulating ring member 13 (to be described later) heated by plasma during bevel cleaning. The coolant channel 11c is connected to a chiller unit (not shown). The lower insulating ring member 13 can be cooled by the coolant supplied from the chiller unit to the coolant channel 11c.

Further, a heater 11d as a heating mechanism is disposed between the coolant channel 11c and the lower ring electrode lib in the stage 11. A heater power supply 40 is connected to the heater 11d through a filter 41. The heater 11d generates heat by power from the heater power supply 40 to heat the stage 11, so that the wafer W supported by the stage 11 can be heated. The filter 41 blocks the RF power used for plasma generation to protect the heater power supply 40 from the RF power.

The stage 11 has a configuration in which the central electrode 11a, the lower ring electrode lib, and the heater 11d are disposed in an insulating member which is made of an insulating material and in which the coolant channel 11c is disposed. Alumina ($Al_2O_3$) or aluminum nitride (AlN) can be used as the insulating material. The central electrode 11a, the lower ring electrode 11b, and the heater 11d are made of a metal material such as copper or aluminum, and formed by printing, for example.

As described above, the stage 11 is formed in a substantially cylindrical shape having a central portion protruding upward. The upper surface of the central portion of the stage 11 protruding upward serves as a wafer supporting surface on which the wafer W is placed. The wafer supporting surface is formed to have a diameter smaller than that of the wafer W. When the wafer W is placed on the wafer supporting surface, the outer peripheral portion of the wafer W projects from the wafer supporting surface. The lower ring electrode 11b is formed such that its inner peripheral portion is disposed under the peripheral portion of the wafer W projecting from the central portion of the stage 11.

The upper surface of the peripheral portion of the stage 11 serves as a ring supporting surface on which the lower insulating ring member 13 is placed. The lower insulating ring member 13 is formed in an annular ring shape that is concentric with the stage 11, and is made of an insulating material such as alumina, aluminum nitride, or the like. The lower insulating ring member 13 is placed on the stage 11 to entirely cover the upper surface of the lower ring electrode 11b, for example. By adjusting the overlapping area of the lower insulating ring member 13 and the lower ring electrode 11b in plan view, the degree of contribution of the lower ring electrode 11b to plasma generation can be adjusted. Further, by providing the lower insulating ring member 13, the uniformity of cleaning of the peripheral portion of the wafer W in the circumferential direction can be improved. The lower insulating ring member 13 can protect from plasma damage the portion of the stage 11 where the lower ring electrode, which is relatively expensive and requires time for replacement, is formed. The lower insulating ring member 13 is placed on the stage 11 such that its inner peripheral portion is disposed under the peripheral portion of the wafer W projecting from the central portion of the stage 11.

In addition, an upper insulating member 14 and a side insulating member 15 are disposed in the processing container 10.

The upper insulating member 14 is made of an insulating material such as alumina, aluminum nitride, or the like, and is disposed above the stage 11 to face the stage 11.

The upper insulating member 14 is formed in a substantially columnar shape that is concentric with the stage 11 and has a central portion protruding downward. A gas injection hole 14a is formed in the lower surface of the central portion of the upper insulating member 14 projecting downward. A gas injection hole 14b is formed in the lower surface of the peripheral portion of the upper insulating member 14. The gas injection holes 14a and 14b are connected to a gas supply source (not shown).

The gas injection hole 14a injects an inert gas, such as argon (Ar) gas or the like, from the gas supply source toward the center of wafer W supported by the stage 11.

The gas injection hole 14b injects a cleaning gas, such as carbon fluoride ($CF_4$) gas or the like, from the gas supply source toward the vicinity of the peripheral portion of the wafer W supported by the stage 11. The gas injection hole 14b is formed at a location that is radially outward from the wafer W supported by the stage 11 in plan view, for example, so that plasma is generated only at the peripheral portion of the wafer W. Specifically, the gas injection hole 14b is formed at a location that is radially outward from an upper ring electrode 16 and an upper insulating ring portion 14c (to be described later) on the lower surface of the upper insulating member 14, for example.

Further, the upper ring electrode 16 is formed on the lower surface of the upper insulating member 14 to surround the outer periphery of the central portion protruding downward.

The upper ring electrode 16 is formed in an annular ring shape that is concentric with the stage 11 to face the upper surface of the peripheral portion of the wafer W supported by the stage 11. The RF power is supplied to the upper ring electrode 16 from the RF power supply mechanism 30 in order to generate plasma in the processing container 10.

Further, the upper insulating ring portion 14c as an upper insulating ring member is integrally formed on the lower surface of the peripheral portion of the upper insulating member 14. The upper insulating ring portion 14c is formed in an annular ring shape that is concentric with the stage 11, and is made of an insulating material such as alumina, aluminum nitride, or the like. The upper insulating ring portion 14c is formed to cover a part (specifically, an outer peripheral portion) of the lower surface of the upper ring electrode 16. By adjusting the overlapping area of the upper insulating ring portion 14c and the upper ring electrode 16 in plan view, the degree of contribution of the upper ring electrode 16 to plasma generation can be adjusted. Further, by providing the upper insulating ring portion 14c, the uniformity of cleaning of the peripheral portion of the wafer W in the circumferential direction can be improved. The upper insulating ring portion 14c can protect from plasma damage the portion of the upper insulating member 14 where the upper insulating ring forming portion, which is relatively expensive and requires time for replacement, is formed. The upper insulating ring portion 14c may be formed to cover the entire lower surface of the upper ring electrode 16.

The side insulating member 15 is an electrically insulating member made of an insulating material such as alumina, aluminum nitride, or the like. The side insulating member 15 covers the inner peripheral surface of the sidewall of the processing container 10. By providing the side insulating member 15, it is possible to suppress the RF power supplied to the lower ring electrode 11b or the upper ring electrode 16 from reaching the sidewall of the processing container 10.

The side insulating member 15 is formed integrally with the upper insulating member 14, for example.

The RF power is supplied to the lower ring electrode 11b and the upper ring electrode 16 from the RF power supply mechanism 30 as described above.

The RF power supply mechanism 30 has an RF power supply 31 and a distributor 32 as shown in FIG. 1.

The RF power supply 31 outputs an RF power having a frequency higher than or equal to 400 kHz and lower than or equal to 100 MHz, for example. The RF power supply 31 is shared by the lower ring electrode 11b and the upper ring electrode 16.

In the present embodiment, one RF power supply 31 is shared by the lower ring electrode 11b and the upper ring electrode 16. However, separate RF power supplies may be used for the lower ring electrode 11b and the upper ring electrode 16 as long as it is possible to synchronize the phases at the same frequency.

The RF power from the RF power supply 31 is supplied to the lower ring electrode lib and the upper ring electrode 16 through the distributor 32. In other words, the distributor 32 distributes the RF power from the RF power supply 31 to the lower ring electrode 11b and the upper ring electrode 16. The distributor 32 is configured to adjust the distribution ratio, i.e., the ratio of the RF power supplied from the common RF power supply 31 to the lower ring electrode lib and the RF power supplied from the common RF power supply 31 to the upper ring electrode 16. The distribution ratio is set in advance depending on the state of the peripheral portion of the wafer W. The RF power supplied to the lower ring electrode 11b and the RF power supplied to the upper ring electrode 16 are obtained by dividing the RF power from the RF power supply 31 by the distributor 32 as described above, and, thus, have the same frequency.

One of the RF powers, coming from the RF power supply 31 and distributed by the distributor 32, is amplified with a predetermined amplification factor by an amplifier 33 and supplied to the lower ring electrode 11b via a matching device 34.

The other RF power distributed by the distributor 32 is phase-adjusted by a phase adjuster 35 and amplified with a predetermined amplification factor by the amplifier 36, and then supplied to the upper ring electrode 16 via a matching device 37.

The phase adjuster 35 adjusts the phase of the RF power supplied to the upper ring electrode 16 such that the phase of the RF power supplied to the lower ring electrode 11b and the phase of the RF power supplied to the upper ring electrode 16 are the same, for example. Further, the phase adjuster 35 may adjust the phase of the RF power supplied to the lower ring electrode 11b such that the phase of the RF power supplied to the lower ring electrode 11b and the phase of the RF power supplied to the upper ring electrode 16 are the same. Further, the phase adjuster 35 may adjust both the phase of the RF power supplied to the lower ring electrode 11b and the phase of the RF power supplied to the upper ring electrode 16 such that the phase of the RF power supplied to the lower ring electrode 11b and the phase of the RF power supplied to the upper ring electrode 16 are the same.

In order to perform the above-described phase adjustment by the phase adjuster 35, a phase detector (not shown) for detecting the phase of the output of the matching device 34 and a phase detector (not shown) for detecting the phase of the output of the matching device 37 may be provided, for example. Further, a controller 60, which will be described later, may control the adjustment amount of the phase of the RF power by the phase adjuster 35 based on the detection results of the phase detectors. The above-described phase detectors may be provided at other portions, and may detect the phase of the output of the amplifier 33 and the phase of the output of the amplifier 36, for example. Further, the adjustment amount of the phase of the RF power by the phase adjuster 35, which allows the phase of the RF power supplied to the lower ring electrode 11b and the phase of the RF power supplied to the upper ring electrode 16 to be the same, may be obtained before the mass production of the wafer processing apparatus 1, and such previously obtained value may be used as the phase adjustment amount during the mass production.

In the wafer processing apparatus 1, as described above, the RF power supplied to the lower ring electrode 11b and the RF power supplied to the upper ring electrode 16 are in phase. Further, the central electrode 11a is grounded. Therefore, as shown in FIG. 3, plasma P1 and P2 can be independently generated between the peripheral portion of the wafer W located above the grounded central electrode 11a and the lower ring electrode 11b, and between the peripheral portion of the wafer W located above the grounded central electrode 11a and the upper ring electrode 16. In other words, the plasma P1 and P2 can be generated independently below the peripheral portion of the wafer W and above the peripheral portion of the wafer W. Hence, by adjusting the power ratio of the RF powers supplied to the lower ring electrode 11b and the upper ring electrode 16, that is, by adjusting the distribution ratio by the distributor 32, the states of the plasma P1 and P2 can be controlled independently below and above the peripheral portion of the wafer W. Specifically, by adjusting the distribution ratio by the distributor 32, for example, any one of the plasma P1 below the peripheral portion of the wafer W and the plasma P2 above the peripheral portion of the wafer W may have a high plasma density, while the other plasma may have a low plasma density. In other words, by adjusting the distribution ratio by the distributor 32, it is possible to independently control the removal speed (hereinafter, referred to as "etching rate") of an unnecessary film on the lower surface of the peripheral portion of the wafer by the plasma P1 and the etching rate on the upper surface of the peripheral portion of the wafer by the plasma P2. Therefore, by appropriately setting the distribution ratio, the removal of the unnecessary film on the lower surface of the peripheral portion of the wafer by the plasma P1 and the removal of the unnecessary film on the upper surface of the peripheral portion of the wafer by the plasma P2 can be completed substantially at the same time.

When the RF power supplied to the lower ring electrode 11b and the RF power supplied to the upper ring electrode 16 have opposite phases, plasma 11 is generated between the lower ring electrode lib and the upper ring electrode 16 as shown in FIG. 4. Therefore, even if the power ratio of the RF power supplied to the lower ring electrode lib and the RF power supplied to the upper ring electrode 16 is adjusted, the plasma state below the peripheral portion of the wafer W and the plasma state below the peripheral portion of the wafer W change in association with each other. The etching rate on the lower surface of the peripheral portion of the wafer and the etching rate on the upper surface of the peripheral portion of the wafer cannot be controlled independently.

In the actual operation of the apparatus, various operations can be performed, such as slight out-of-phase and 90° out-of-phase as well as exact in-phase.

Further, in the wafer processing apparatus 1, the central electrode 11a is grounded via the impedance adjustment circuit 50. The impedance adjustment circuit 50 adjusts the impedance between the ground and the plasma generated in the processing chamber 10 through the central electrode 11a and the wafer W. Specifically, the impedance adjustment circuit adjusts the above impedance to be smaller than the impedance between the plasma and the ground through the sidewall of the processing container 10. More specifically, the impedance adjustment circuit adjusts the above impedance to be smaller than the impedance between the plasma and the ground through the side insulating member 15 and the sidewall of the processing container 10. The impedance adjustment circuit 50 has, e.g., a capacitor. Further, the impedance adjustment circuit may have an inductor instead of the capacitor or in addition to the capacitor. A variable capacitor whose capacitance can be adjusted or a variable inductor whose inductance can be adjusted may be used as the capacitor and the inductor.

The wafer processing apparatus 1 configured as described above includes the controller 60. The controller 60 is a computer including, e.g., a CPU, a memory, or the like, and includes a program storage (not shown). The program storage stores a program for performing wafer processing (to be described later) in the wafer processing apparatus 1, or the like. The program may be recorded in a computer-readable storage medium and installed in the controller 60 from the storage medium. Further, the program may be partially or entirely implemented by a dedicated hardware (circuit board).

Next, an example of the wafer processing performed using the wafer processing apparatus 1 will be described. The following series of processes are performed under the control of the controller 60. The wafer W to be processed by the wafer processing apparatus 1 has been subjected to film formation.

First, the wafer W is loaded into the processing container 10, and placed on the stage 11 via lift pins (not shown), for example. Then, the switch 22 is switched to apply a DC voltage from the DC power supply 20 to the central electrode 11a of the stage 11. Accordingly, the wafer W is electrostatically attracted and held on the stage 11 by an electrostatic force thus generated. After the wafer W is loaded, the processing container 10 is depressurized to a predetermined vacuum level by an exhaust mechanism (not shown).

Next, an inert gas such as argon gas or the like, and a cleaning gas such as fluorocarbon gas or the like are supplied into the processing container 10 through the gas injection holes 14a and 14b. Further, the RF power for plasma generation is supplied from the RF supply mechanism 30 to the lower ring electrode 11b and the upper ring electrode 16, thereby generating plasma in the processing container 10. In the wafer processing apparatus 1, the electrode to which the RF power from the RF supply mechanism 30 is supplied is not disposed at a position facing the central portion of the wafer W, but is disposed at a position facing the peripheral portion of the wafer W. Therefore, in the wafer processing apparatus 1, the plasma generated by the RF power can be concentrated near the peripheral portion of the wafer W. In other words, in the wafer processing apparatus 1, plasma can be efficiently generated near the peripheral portion of the wafer W. By the action of the plasma thus generated, the peripheral portion of the wafer W is cleaned and an unnecessary film is removed.

The distribution ratio of the RF power by the distributor 32 during the cleaning is set as follows, for example. In other words, as described above, the RF powers having the same phase are supplied to the lower ring electrode 11b and the upper ring electrode 16, so that the plasma P1 and P2 are independently generated below and above the peripheral portion of the wafer W. The distribution ratio of the RF power by the distributor 32 is preset depending on the state of the upper surface and the lower surface of the wafer W so that the cleaning of the lower surface of the peripheral portion of the wafer W by the plasma P1 and the cleaning of the upper surface of the peripheral portion of the wafer W by the plasma P2 are completed substantially at the same time. By setting the distribution ratio as described above, an unnecessary film can be completely removed from both the lower surface and the upper surface of the peripheral portion of the wafer W without damaging the wafer W, that is, without overetching.

In order to end the cleaning process, the supply of the RF power from the RF supply mechanism 30 and the supply of the cleaning gas are stopped. Next, the switch 22 is switched, and the application of the DC voltage to the central electrode 11a of the stage 11 is stopped. Accordingly, the attraction and holding of the wafer W on the stage 11 is released.

Then, the wafer W is removed from the stage 11 via lift pins (not shown) and unloaded from the processing container 10. In this manner, a series of wafer processing is ended.

As described above, in the present embodiment, the wafer processing apparatus 1 for cleaning the peripheral portion of the wafer W by plasma includes the stage 11 that supports the wafer W and includes the central electrode 11a facing the central portion of the supported wafer W. In the present embodiment, the wafer processing apparatus 1 further includes the lower ring electrode 11b formed in an annular shape to face the lower surface of the peripheral portion of the wafer W supported on the stage 11, and the upper ring electrode 16 disposed to face the upper surface of the peripheral portion of the wafer W supported on the stage 11. Further, in the present embodiment, the central electrode 11a is grounded. In the present embodiment, the RF powers having the same frequency are supplied to the upper ring electrode 16 and the lower ring electrode 11b. Particularly, the RF power is supplied to the upper ring electrode 16 through the phase adjuster 35. Therefore, in the present embodiment, the RF power supplied to the upper ring electrode 16 and the RF power supplied to the lower ring electrode 11b may have the same phase. Accordingly, it is possible to independently control the plasma state below and above the peripheral portion of the wafer W. Hence, in the present embodiment, even if the film formation state is different between the upper surface and the lower surface of the peripheral portion of the wafer W, the unnecessary film on the peripheral portion of the wafer W can be appropriately removed without damaging the wafer W.

The following method may be considered as an example of a method for independently controlling the plasma state above and below the peripheral portion of the wafer W. In other words, in this method, a structure similar to the wafer processing apparatus of the present embodiment is adopted; the RF power is supplied to the central electrode 11a; the upper ring electrode 16 and the lower ring electrode 11b are grounded; and the impedance through the upper ring electrode 16 and the impedance through the lower ring electrode 11b are independently controlled. In this method, the RF power supplied to the position above or below the peripheral portion of the wafer W is not directly adjusted, but is indirectly adjusted by adjusting the impedance. Therefore, in this method, the etching rate is adjusted differently between the position above the peripheral portion of the wafer W and the position below the peripheral portion of the wafer W only to the extent within the impedance change, and, thus, there is a room to further improve the controllability. In the present method, the RF power supplied to the position above or below the peripheral portion of the wafer W is controlled by adjusting the power ratio of the RF power supplied to the upper ring electrode 16 and the RF power supplied to the lower ring electrode 11b. Therefore, the controllability is improved by setting the etching rate to be considerably different between the position above the peripheral portion of the wafer W and the position below the peripheral portion of the wafer W.

In the present embodiment, the stage 11 has therein the heater 11d. Therefore, in the wafer processing apparatus 1, a heating process such as an annealing process or the like can also be performed on the wafer W, in addition to the cleaning of the peripheral portion of the wafer W. For example, in the wafer processing apparatus 1, the wafer W that has been subjected to chemical vapor liquid film can be subjected to a cleaning process and then to an annealing process. It is also possible to perform the cleaning process while performing the annealing process. In the chemical vapor liquid film formation, an intermediate film having fluidity is formed on the substrate. By performing the annealing process, the intermediate film having fluidity can be solidified and changed to an insulating film. Further, in the chemical vapor liquid processing, an unintended film may be adhered to the peripheral portion of the wafer W. The unintended film can be removed by performing the cleaning process.

The functions of the distributor 32, the phase adjuster 35, and the amplifiers 33 and 36 in the above example may be implemented by one transformer. In this case, the RF power from the RF power supply is supplied to the transformer via a matching device. The transformer distributes the supplied RF power at a predetermined distribution ratio, for example, and amplifies one of the distributed RF powers and supplies it to the lower ring electrode 11b. Further, the transformer amplifies the other one of the distributed RF powers and supplies it to the upper ring electrode 16 at the same phase as that of the one RF power.

In the above example, the RF power supplied to the lower ring electrode 11b and the RF power supplied to the upper ring electrode 16 are in phase. However, the phase of the RF power supplied to the lower ring electrode lib and the phase of the RF power supplied to the upper ring electrode 16 are not necessarily exactly the same, and may be different as long as the upper surface and the lower surface of the peripheral portion of the wafer W can be appropriately processed. Specifically, if the phase difference between the RF power supplied to the lower ring electrode 11b and the RF power supplied to the lower ring electrode 11b is λ/4 or less, such different phases may be tolerated. In other words, the phase of the RF power supplied to the lower ring electrode 11b and the phase of the RF power supplied to the upper ring electrode 16 may be different from each other by about ±λ/8 from the reference phase.

In the above example, the distribution ratio by the distributor 32 is preset depending on the state of the peripheral portion of the wafer W. Instead, it is also possible to provide an optical film thickness measuring device for measuring the film thickness on the upper surface and the lower surface of the peripheral portion of the wafer W, for example. The controller 60 may determine the distribution ratio based on the measurement result of the film thickness measuring device, and the distributor 32 may distribute the power based on the distribution ratio.

Reference Embodiment

In the above embodiment, the RF power supplied to the lower ring electrode 11b and the RF power supplied to the upper ring electrode 16 have the same frequency and the same phase, so that the plasma states above and below the peripheral portion of the wafer W can be controlled independently. On the other hand, in the reference embodiment, the RF power supplied to the lower ring electrode 11b and the RF power supplied to the upper ring electrode 16 have slightly different frequencies, so that the plasma states above and below the peripheral portion of the wafer W can be independently controlled. For example, the plasma state above and below the peripheral portion of the wafer W can be independently controlled such that the relationship between a frequency FH on the high frequency RF power side and a frequency FL on the low frequency RF power side satisfies FL<FH<1.5×FL.

In the reference embodiment, separate RF power supplies are respectively used for supplying an RF power to the lower ring electrode 11b and upper ring electrode 16.

The RF power from the RF power supply is supplied to the lower ring electrode lib through a filter and a matching device. The filter is used to block the RF power from the RF power supply for the upper ring electrode 16.

On the other hand, the RF power from the RF power supply for the upper ring electrode 16 is supplied to the upper ring electrode 16 via a filter and a matching device. The filter is used to block the RF power from the RF power supply for the lower ring electrode lib.

It should be noted that the embodiments of the present disclosure are illustrative in all respects and are not restrictive. The above-described embodiments may be omitted, replaced, or changed in various forms without departing from the scope of the appended claims and the gist thereof.

DESCRIPTION OF REFERENCE NUMERALS

1: wafer processing apparatus
10: processing container
11: stage
11a: central electrode
11b: lower ring electrode
16: upper ring electrode
35: phase adjuster
P1: plasma
P2: plasma
W: wafer

The invention claimed is:

1. A plasma processing apparatus for cleaning a peripheral portion of a substrate by plasma, comprising:
a depressurizable processing container accommodating a substrate;
a phase adjuster; and
a controller,
wherein the depressurizable processing container includes therein:
a substrate support configured to support a substrate and including a central electrode facing a central portion of the substrate supported by the substrate support;
a lower ring electrode formed in a ring shape to face a lower surface of a peripheral portion of the substrate supported by the substrate support; and
an upper ring electrode disposed to face an upper surface of the peripheral portion of the substrate supported by the substrate support,
wherein the central electrode is grounded,
a radio frequency (RF) power is supplied to each of the upper ring electrode and the lower ring electrode,
the RF power is supplied to at least one of the upper ring electrode and the lower ring electrode via the phase adjuster configured to adjust the phase of the RF power, and
the controller is configured to control the RF power supplied to the upper ring electrode and the RF power supplied to the lower ring electrode between in phase and anti- phase by controlling the phase adjuster.

2. The plasma processing apparatus of claim 1, wherein the RF power supplied to the upper ring electrode and the RF power supplied to the lower ring electrode are in phase.

3. The plasma processing apparatus of claim 1, further comprising an impedance adjustment circuit, wherein the substrate support is grounded via the impedance adjustment circuit.

4. The plasma processing apparatus of claim 3, wherein a sidewall of the depressurizable processing container is grounded, and
the impedance adjustment circuit is configured to adjust an impedance between the plasma and the ground through the central electrode of the substrate support to be smaller than the impedance between the plasma and the ground through the sidewall of the depressurizable processing container.

5. The plasma processing apparatus of claim 4, further comprising an insulating member having an electrical insulating property, wherein an inner surface of the sidewall of the depressurizable processing container is covered with the insulating member.

6. The plasma processing apparatus of claim 1, further comprising a common RF power supply and a power distributer, wherein the RF power is supplied to each of the upper ring electrode and the lower ring electrode, from the common RF power supply via the power distributor, and
the power distributor is configured to adjust a ratio of the RF power supplied from the common RF power supply to the upper ring electrode and the RF power supplied from the common RF power supply to the lower ring electrode.

7. A plasma processing method for cleaning a peripheral portion of a substrate by plasma using a plasma processing apparatus,
wherein the plasma processing apparatus includes:
a substrate support configured to support a substrate and including a central electrode facing a central portion of the substrate supported by the substrate support;
a lower ring electrode formed in an annular shape to face a lower surface of the peripheral portion of the substrate supported by the substrate support; and
an upper ring electrode disposed to face an upper surface of the peripheral portion of the substrate supported by the substrate support;
the method comprising:
supplying an RF power to each of the upper ring electrode and the lower ring electrode in a state where the central electrode is grounded,
wherein said supplying the RF power includes:
adjusting a phase of at least one of the RF power supplied to the upper ring electrode and the RF power supplied to the lower ring electrode such that the RF power supplied to the upper ring electrode and the RF power supplied to the lower ring electrode are between in phase and anti-phase.

8. The plasma processing apparatus of claim 1, further comprising an insulating member having an electrical insulating property, wherein an inner surface of a sidewall of the depressurizable processing container is covered with the insulating member.

* * * * *